(12) United States Patent
Kubota et al.

(10) Patent No.: US 8,748,282 B2
(45) Date of Patent: Jun. 10, 2014

(54) SEMICONDUCTOR DEVICE AND METHOD OF MANUFACTURING THE SAME

(75) Inventors: Ryo Kubota, Kanagawa (JP); Nobutaka Nagai, Kanagawa (JP); Satoshi Kura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 259 days.

(21) Appl. No.: 13/169,626

(22) Filed: Jun. 27, 2011

(65) Prior Publication Data

US 2011/0256686 A1 Oct. 20, 2011

Related U.S. Application Data

(62) Division of application No. 12/130,096, filed on May 30, 2008, now Pat. No. 7,985,997.

(30) Foreign Application Priority Data

May 30, 2007 (JP) ................................. 2007-143146

(51) Int. Cl.
*H01L 29/72* (2006.01)

(52) U.S. Cl.
USPC ............ 438/386; 438/171; 438/255; 438/694

(58) Field of Classification Search
USPC .................. 438/171, 255, 386, 694
See application file for complete search history.

(56) References Cited

U.S. PATENT DOCUMENTS

| | | | |
|---|---|---|---|
| 6,534,377 B2 | 3/2003 | Taniguchi | |
| 2002/0094617 A1* | 7/2002 | Taniguchi | 438/171 |
| 2003/0008512 A1* | 1/2003 | Ali et al. | 438/694 |
| 2005/0045276 A1* | 3/2005 | Patel et al. | 156/345.43 |
| 2005/0124114 A1* | 6/2005 | Ichimura | 438/255 |
| 2006/0258112 A1 | 11/2006 | Takaishi | |
| 2007/0228427 A1* | 10/2007 | Matsui et al. | 257/288 |

FOREIGN PATENT DOCUMENTS

| | | |
|---|---|---|
| JP | 11-087650 | 3/1999 |
| JP | 2000-156479 | 6/2000 |
| JP | 2000-196039 | 7/2000 |
| JP | 2002-217375 | 8/2002 |
| KR | 10-0388206 | 6/2003 |

OTHER PUBLICATIONS

Korean Patent Office issued a Korean Office Action dated Mar. 29, 2010, Application No. 10-2008-0046688.
Chinese Patent Office issued a Chinese Office Action dated Aug. 21, 2009, Application No. 200810108448.
JP Office Action dated Jul. 24, 2012, with English translation; Application No. 2007-143146.

* cited by examiner

*Primary Examiner* — Edward Wojciechowicz
(74) *Attorney, Agent, or Firm* — Young & Thompson

(57) ABSTRACT

A semiconductor device is manufactured by forming a hole as being extended through a first insulating film and an insulating interlayer stacked over a semiconductor substrate, allowing side-etching of the inner wall of the hole to proceed specifically in a portion of the insulating interlayer, to thereby form a structure having the first insulating film projected out from the edge towards the center of the hole; forming a lower electrode film as being extended over the top surface, side face and back surface of the first insulating film, and over the inner wall and bottom surface of the hole; filling a protective film in the hole; removing the lower electrode film specifically in portions fallen on the top surface and side face of the first insulating film; removing the protective film; and forming a cylindrical capacitor in the hole.

20 Claims, 7 Drawing Sheets

SEMICONDUCTOR DEVICE AND METHOD OF MANUFACTURING THE SAME

This application is based on Japanese patent application No. 2007-143146 the content of which is incorporated hereinto by reference.

BACKGROUND

1. Technical Field

The present invention relates to a semiconductor device containing a cylindrical capacitor, and a method of manufacturing the same.

2. Related Art

A memory cell of dynamic random access memory (DRAM) is composed of one transistor and one capacitor. Structure of the capacitor of DRAM has drastically changed with shrinkage of the semiconductor device. The capacitors for the memory cell is exemplified by those of flat type, stacked type, cylinder type, trench type and so forth, wherein the cylindrical capacitor is widely used at present as one of capacitor most suitable for higher integration.

The cylindrical capacitor is configured, as the name indicates, by stacking a lower electrode, an insulating film and an upper electrode in this order so as to cover a cylindrically patterned hole under good step coverage. Because the capacitor portion is formed after patterning the hole, the cylindrical capacitor is less likely to cause short-circuiting between the adjacent DRAM memory cells, and is therefore suitable for large scale integration. It has, however, been becoming more difficult for the capacitor, even if it were of cylindrical type, to ensure a sufficient level of capacitance under an increasing trend of downsizing, raising an expectation to a technique of increasing the capacitance anyhow.

Japanese Laid-Open Patent Publication No. H11-87650 describes a semiconductor device having a cylindrical capacitor. A method of manufacturing the semiconductor device having the cylindrical capacitor will be explained referring to FIGS. 5A to 6C.

First, a shown in FIG. 5A, a (second) insulating film 180 is formed over a silicon substrate 110, and a contact 190 is formed by a publicly-known method. An insulating interlayer 120 is then formed thereon (generally to as thick as 500 nm to 1.2 μm or around), and patterned through a photoresist film, to thereby form a hole 130. Then, as shown in FIG. 5B, an electroconductive lower electrode film 141 is formed.

Portion of the lower electrode film 141 fallen on the insulating interlayer 120 may be causative of short-circuiting between the adjacent DRAM memory cells, and must therefore be removed.

Possible methods of removing the lower electrode film 141 include those based on etchback and CMP (chemical mechanical polishing).

In the method based on etchback, the hole 130 is filled with a protective film 170 as shown in FIG. 5C, so as to prevent the lower electrode film 141 in the hole 130 from being etched. In general, a photoresist film is used as the protective film 170. In this configuration, the protective film 170 (photoresist film) may be left only inside the hole 130, if the film is appropriately exposed to light after formation thereof. The protective film 170 may readily be removed after the lower electrode film 141 was etched back. In this way, a part of the lower electrode film 141 is removed, and thereby a state shown in FIG. 5D may be obtained.

Next, as shown in FIG. 6A, a capacitor insulating film 142 and an electroconductive upper electrode 143 are successively formed. The capacitor insulating film 142 and the upper electrode 143 are then patterned using a photoresist film, to thereby obtain a structure shown in FIG. 6B. It is to be understood that, although the drawings herein show patterning for only a single DRAM memory cell for the convenience' sake, the capacitor insulating film 142 and the upper electrode 143 in practice are provided commonly with the other DRAM memory cells. Lastly, an insulating film 160 is formed so as to form a cylindrical capacitor 140 shown in FIG. 6C, to thereby obtain the semiconductor device.

Japanese Laid-Open Patent Publication No. H11-87650 describes a semiconductor integrated circuit device having a cylindrical capacitor. Japanese Laid-Open Patent Publication No. 2000-196039 describes a method of manufacturing a semiconductor memory device using CMP, aiming at preventing the lower electrode film or the like from being damaged by etching.

The present inventors have recognized as follows. Because the lower electrode film is removed by etchback in the procedures of the method of manufacturing a semiconductor device having a cylindrical capacitor as shown in FIGS. 5A to 5D and FIGS. 6A to 6C, the method has raised a problem in that the upper end portion of the lower electrode film 141 formed over the inner wall of the hole 130 may be removed by the etchback as shown in FIG. 5D. Such nonconformity has raised a problem in that the lower electrode film 141 may be reduced in the surface area, and thereby the capacitance may be reduced. Even if the protective film 170 (photoresist film) should be formed so as to completely fill the hole 130 as shown in FIG. 5C, it may be difficult to avoid loss or removal of the upper end portion of the lower electrode film 141 in the etchback.

On the other hand, the CMP process as described in Japanese Laid-Open Patent Publication No. 2000-196039 may be likely to generate dust or scratching, and may therefore be not suitable at present as a method of forming a capacitance susceptible to leakage through the capacitor film.

SUMMARY

According to the present invention, there is provided a method of manufacturing a semiconductor device containing stacking, over a semiconductor substrate, an insulating interlayer and a first insulating film in this order;

selectively removing the first insulating film and the insulating interlayer in this order, to thereby form a hole as being extended through the first insulating film and the insulating interlayer;

allowing side-etching of the inner wall of the hole to proceed specifically in a portion of the insulating interlayer, to thereby form a structure having the first insulating film projected out from the edge towards the center of the hole;

forming a lower electrode film as being extended over the top surface, side face and back surface of the first insulating film, and over the inner wall and bottom surface of the hole;

filling a protective film in the hole;

removing the lower electrode film specifically in portions over the top surface and side face of the first insulating film;

removing the protective film; and stacking, in the hole and over the lower electrode film, a capacitor insulating film and an upper electrode in this order.

According to the present invention, the first insulating film is configured as being projected out from the edge towards the center of the hole, so that the upper end portion of the lower electrode film at the upper portion of the hole may be prevented from being lost or removed, when portions of the lower electrode film fallen on the top surface and side face of the first insulating film is removed.

According to the present invention, there is also provided a semiconductor device having a semiconductor substrate;

an insulating interlayer formed over the semiconductor substrate;

a first insulating film formed over the insulating interlayer; and a cylindrical capacitor filled in a hole formed as being extended through the insulating interlayer and the first insulating film, wherein the first insulating film is configured as being projected out from the edge towards the center of the hole, the cylindrical capacitor is configured as having a lower electrode film, a capacitor insulating film and an upper electrode stacked in this order, and the top surface of the lower electrode film is covered by the projected portion of the first insulating film at the upper portion of the hole.

According to the present invention, the first insulating film is configured as being projected out from the edge towards the center of the hole, and the top surface of the lower electrode film is covered by the projected portion of the first insulating film at the upper portion of the hole, so that the upper end portion of the lower electrode film may be prevented from being lost or removed at the upper portion of the hole. The lower electrode film may therefore be prevented from reducing the surface area thereof, and thereby the capacitance may be prevented from being lowered.

According to the present invention, loss or removal of the upper end portion of the lower electrode film contained in the cylindrical capacitor, may be suppressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
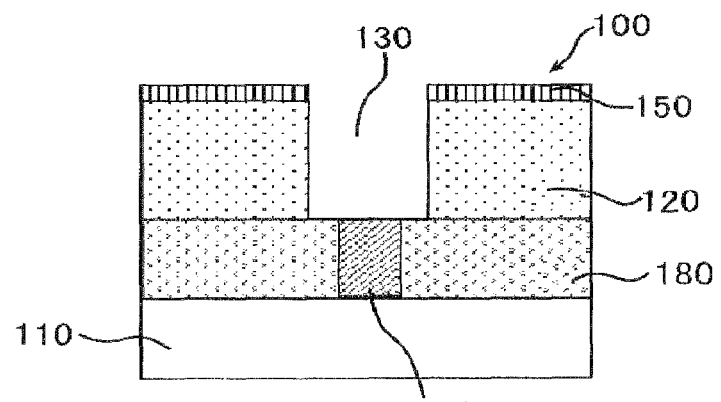
FIGS. 1A to 1D, and FIGS. 2A to 2D are sectional views showing procedures of manufacturing a semiconductor device according to an embodiment of the present invention.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention, referring to the attached drawings. It is to be noted that any similar constituents in all drawings will be given with similar reference numerals, so as to avoid repetitive explanation.

First Embodiment

Figure 2A:
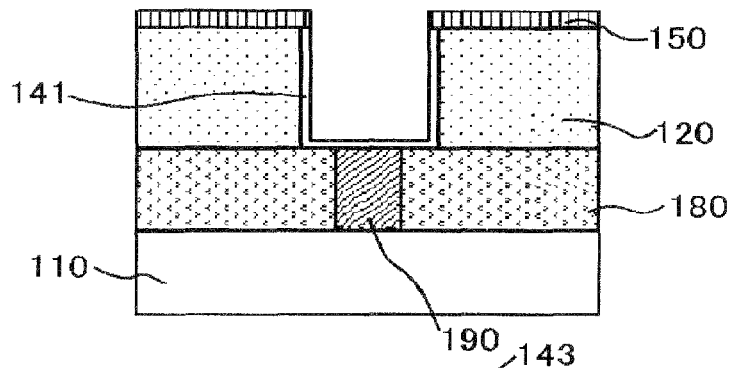
Figure 2B:
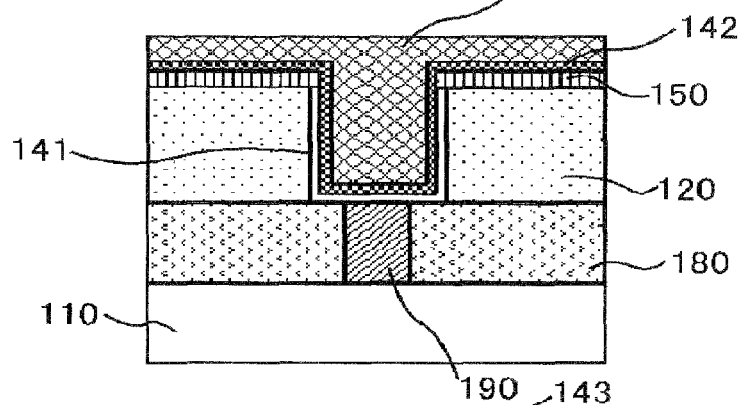
Figure 2C:
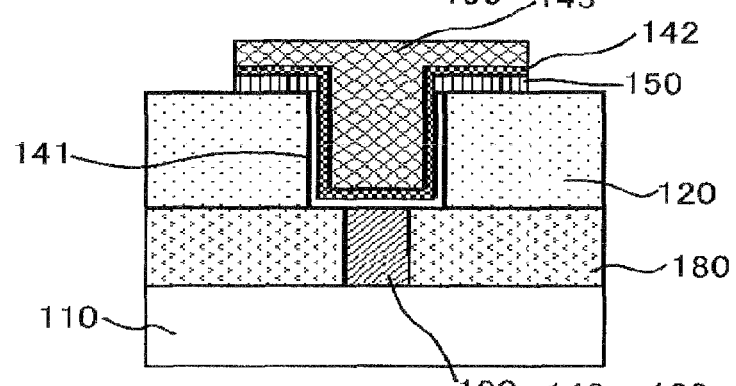
Figure 2D:
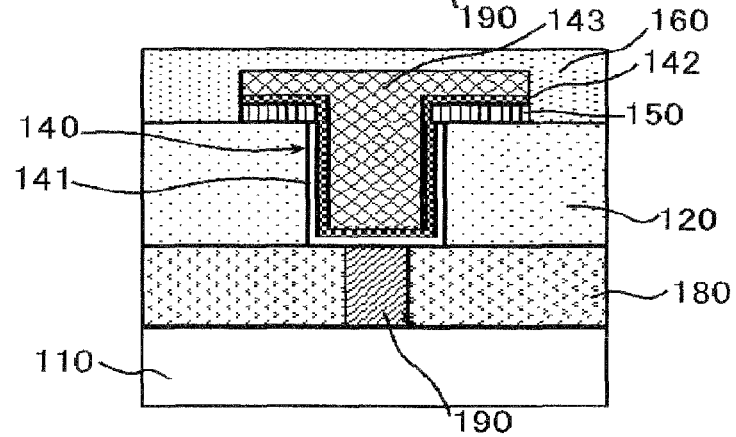

A semiconductor device 100 contains the silicon substrate 110, the second insulating film 180 formed thereon, the insulating interlayer 120 formed thereon, the first insulating film 150 formed thereon, the cylindrical capacitor 140 filled in the hole 130 formed as being extended through the insulating interlayer 120 and the first insulating film 150, and the insulating film 160 formed thereon (FIG. 2D).

Figure 6A:
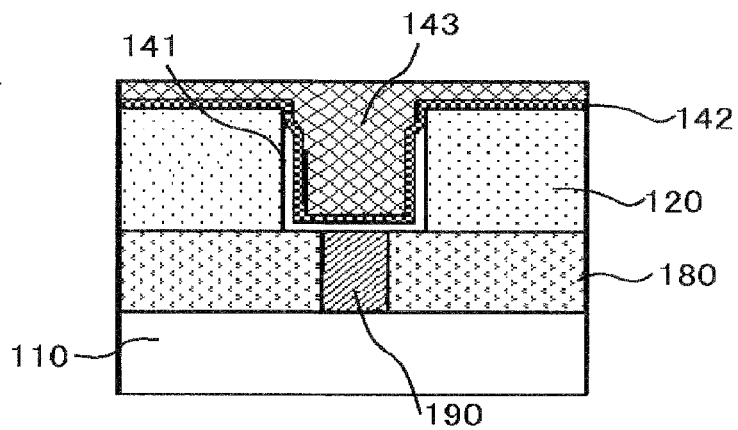
Figure 6B:
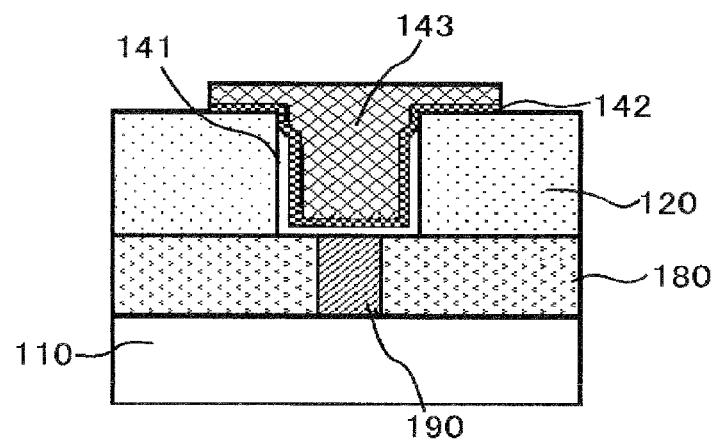
Figure 6C:
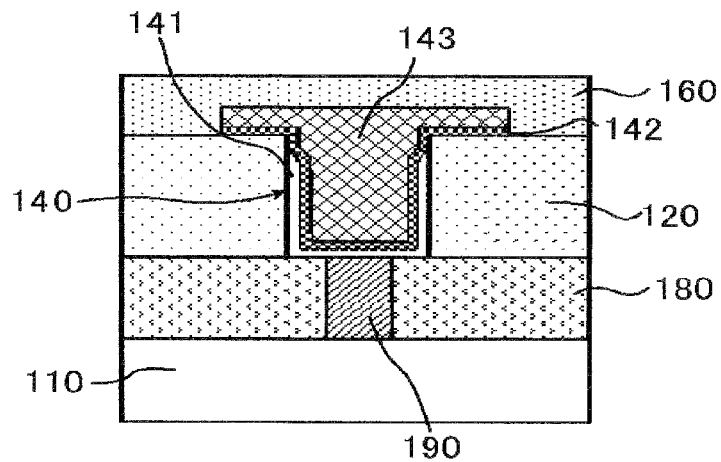

The semiconductor device 100 shown in FIG. 2D was manufactured by procedures similar to those for manufacturing the conventional semiconductor device shown in FIG. 6C, but is different from the conventional device in that the first insulating film 150 functions as a mask protecting the upper end portion of the lower electrode film 141 formed on the upper portion of the inner wall of the hole 130.

The cylindrical capacitor 140 is buried in the hole 130 formed as being extended through the insulating interlayer 120 and the first insulating film 150. The cylindrical capacitor 140 is configured as having the capacitor insulating film 142 and the upper electrode 143 stacked in this order over the lower electrode film 141.

The top surface of the lower electrode film 141 is covered by the projected portion of the first insulating film 150 at the upper portion of the hole 130.

The lower electrode film 141 is formed so as to cover the inner wall of the hole 130. The lower electrode film 141 is configured as being held, along the inner wall of the hole 130, between the insulating interlayer 120 and the capacitor insulating film 142, wherein the top surface of the lower electrode film 141 is covered by the projected portion of the first insulating film 150. There has conventionally been a problem in that, as shown in FIG. 6C, the upper end portion of the lower electrode film 141 at the upper portion of the hole 130 is likely to be removed by etchback, whereas the semiconductor device 100 of this embodiment may suppress loss of the upper end portion of the lower electrode film 141. In other words, the top surface of the lower electrode film 141 is covered by the projected portion of the first insulating film 150, so that loss or removal of the upper end portion of the lower electrode film 141 may be suppressed. In other words, decrease in the surface area of the lower electrode film 141 may be suppressed. It may be good enough that at least the top surface of the lower electrode film 141 at the upper portion of the inner wall of the hole 130, out of the entire lower electrode film 141, is covered by the projected portion of the first insulating film 150.

The insulating interlayer 120 and the first insulating film 150 are stacked in this order. The insulating interlayer 120 and the first insulating film 150 has the hole 130 formed as being extended therethrough.

The first insulating film 150 is formed over the insulating interlayer 120, and is configured as being projected out from the edge towards the center of the hole 130. The first insulating film 150 has a form of pent roof projecting out towards the center of opening of the hole 130, and covering the top portion of the hole 130. By virtue of this geometry, the upper end portion of the lower electrode film 141 formed at the upper portion of the inner wall of the hole 130 may be protected from being etched.

The second insulating film 180 is provided between the silicon substrate 110 and the insulating interlayer 120. The second insulating film 180 has the contact 190 formed therein. The contact 190 is electrically connected to the lower electrode film 141 owned by the cylindrical capacitor 140. Although not shown, the periphery of the contact 190 is covered with a barrier metal. The contact 190 may be good enough if it is made of a material not removable by etching. Such material composing the contact 190 may be exemplified by copper, tungsten and so forth.

FIGS. 1A to 1D and FIGS. 2A to 2D are sectional views showing procedures of manufacturing the semiconductor device of the this embodiment.

A method of manufacturing the semiconductor device 100 of this embodiment includes the steps of:

(A) stacking the insulating interlayer and the first insulating film in this order over the semiconductor substrate;

(B) selectively removing the first insulating film and the insulating interlayer in this order, to thereby form the hole as being extended through the first insulating film and the insulating interlayer;

(C) allowing side-etching of the inner wall of the hole to proceed specifically in a portion of the insulating interlayer, to thereby form a structure having the first insulating film projected out from the edge towards the center of the hole;

(D) forming a lower electrode film as being extended over the top surface, side face and back surface of the first insulating film, and over the inner wall and bottom surface of the hole;

(E) filling a protective film in the hole;

(F) removing the lower electrode film specifically in portions fallen on the top surface and side face of the first insulating film;

(G) removing the protective film; and (H) stacking, in the hole and over the lower electrode film, a capacitor insulating film and an upper electrode in this order.

The individual steps will be detailed below.

First, as shown in FIG. 1A, by publicly-known methods, the second insulating film 180 is formed over the silicon substrate 110, the contact hole is formed as being extended through second insulating film 180, and the contact 190 is formed in the contact hole. Further thereon, the insulating interlayer 120 (generally to as thick as 500 nm to 1.2 μm or around), and the first insulating film 150 are stacked in this order. Next, a photoresist film is patterned on the first insulating film 150, and the insulating interlayer 120 and the first insulating film 150 are selectively removed through the patterned photoresist film by a publicly-known etching method, to thereby form the hole 130 as being extended through the insulating interlayer 120 and the first insulating film 150.

Materials composing the second insulating film 180 may be exemplified by a silicon nitride film.

Figure 1B:
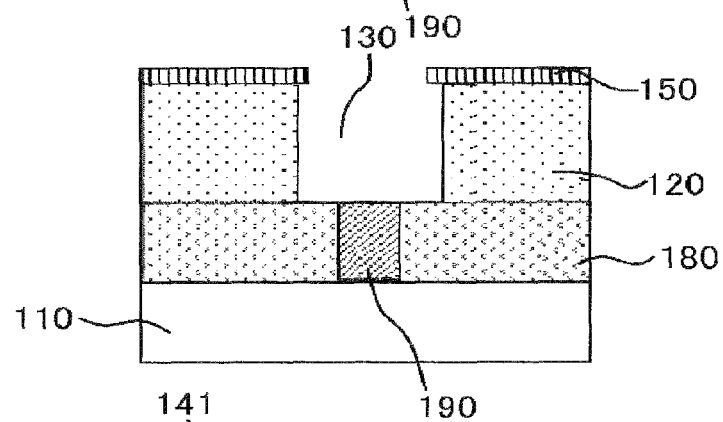

Next, as shown in FIG. 1B, the inner wall of the hole 130 is laterally etched specifically in a portion of the insulating interlayer 120, to thereby form a structure having the first insulating film 150 projected out from the edge towards the center of the hole 130. In other words, the first insulating film 150 is formed as being projected out from the edge of the hole 130 towards the inside (centerward) of the hole 130.

The length of the projected portion, that is, the length of projection measured from the edge of the hole 130 to the end of inward projection, is preferably same with the thickness of the lower electrode film 141. It may be good enough for the projected portion to have a length just as long as sufficiently covering the top surface of the lower electrode film 141 at the upper portion of the inner wall of the hole 130. More specifically, the length is preferably 10 to 80 nm or around. By virtue of this configuration, the upper end portion of the lower electrode film 141 may be prevented from being lost or removed.

A method based on wet etching may typically be adopted as a method of allowing side-etching of the portion of the insulating interlayer 120 to proceed. For the wet etching, hydrofluoric acid-containing chemical solution, such as diluted hydrofluoric acid, buffered hydrofluoric acid and so forth, may preferably be adopted.

Materials for composing the insulating interlayer 120 may be exemplified by a silicon oxide film. Materials for composing the first insulating film 150 may be exemplified by a silicon nitride film. Although a silicon nitride film was exemplified as a material for composing the second insulating film 180, the material is not limited thereto, instead allowing any materials less susceptible to dry etching or side-etching of the insulating interlayer 120.

Thickness of the first insulating film 150 may sufficiently be 20 to 100 nm or around.

Figure 1C:
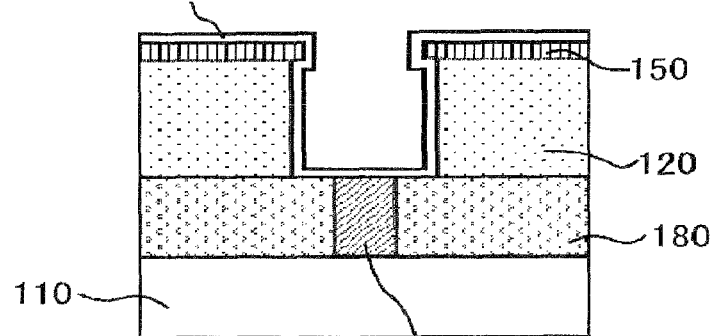

Next, as shown in FIG. 1C, the lower electrode film 141 is formed as being extended over the top surface, side face and back surface of the first insulating film 150, and over the inner wall and bottom surface of the hole 130.

Conditions for forming the lower electrode film 141 may appropriately be set. The film may be formed typically by adopting, as a target, a material desired to be sputtered to produce the lower electrode film 141, or by adopting reactive sputtering process under a nitrogen-containing atmosphere. In this way, the film may be formed also to the portion right under the projected portion of the first insulating film 150.

Materials for composing the lower electrode film 141 may be those showing electro-conductivity, and may be exemplified by titanium nitride (TiN), phosphorus-doped polysilicon, and so forth.

Thickness of the lower electrode film 141 may preferably be 10 to 80 nm or around. Elevation in the resistivity may be suppressed by adjusting the thickness to 10 nm or larger, whereas reduction in surface area of the lower electrode film 141 and consequent lowering in the capacitance may be suppressed by adjusting the thickness to 80 nm or smaller.

Figure 1D:
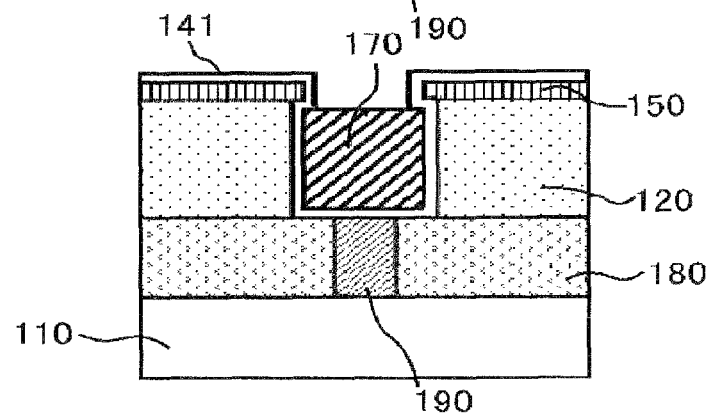

Next, as shown in FIG. 1D, the protective film 170 is filled in the hole 130.

By providing the protective film 170, the lower electrode film 141 in the hole 130 may be prevented from being etched when the portion of the lower electrode film 141 fallen on the first insulating film 150 is etched back.

Materials composing the protective film 170 may be exemplified by photoresist film. By using the photoresist, and by appropriately irradiating the photoresist with light after formation of the film by a publicly-known method, the hole 130 may be filled with the photoresist. The photoresist may readily be removed after the lower electrode film 141 is etched back.

Next, as shown in FIG. 2A, the lower electrode film 141 is removed specifically in the portions thereof fallen on the top surface and side face of the first insulating film 150, and the protective film 170 is then removed.

By removing the lower electrode film 141 on the first insulating film 150, the adjacent DRAM memory cells are prevented from being short-circuited.

Figure 5A:
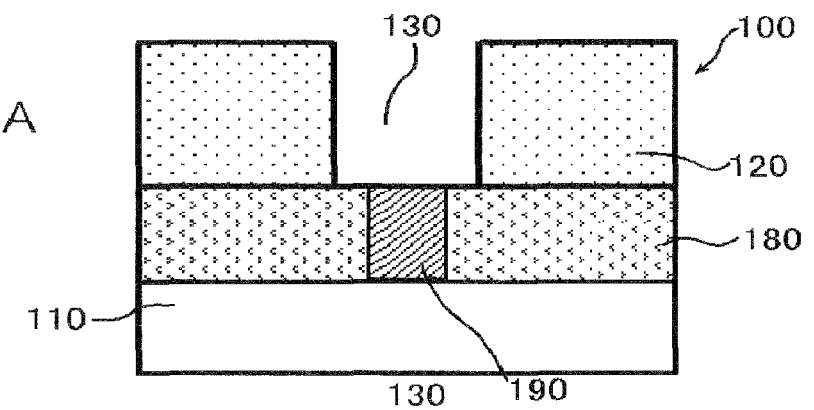
FIGS. 5A to 5D, and FIGS. 6A to 6C are sectional views showing conventional procedures of manufacturing a semiconductor device.
Figure 5B:
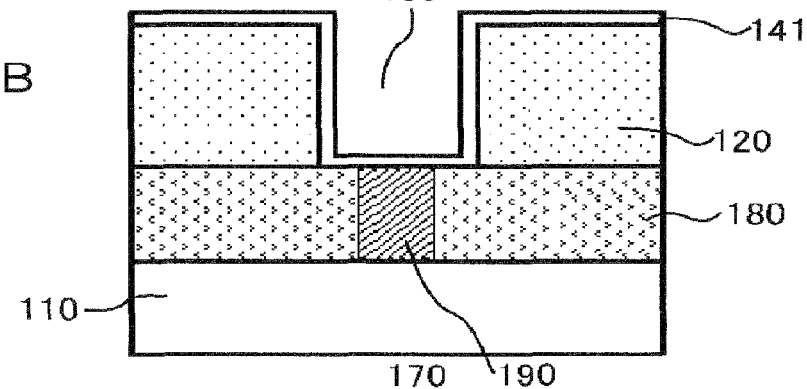
Figure 5C:
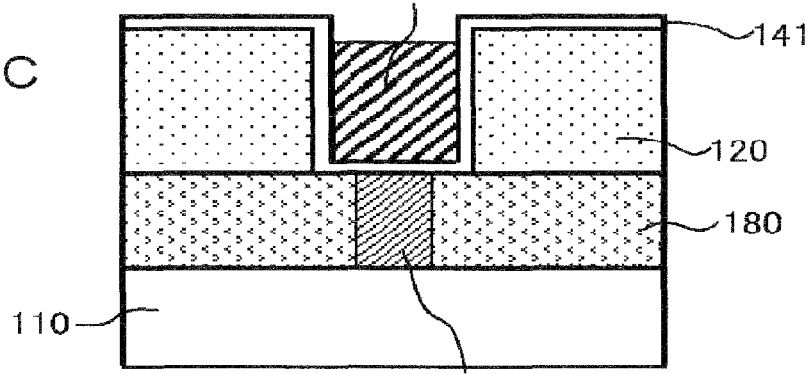
Figure 5D:
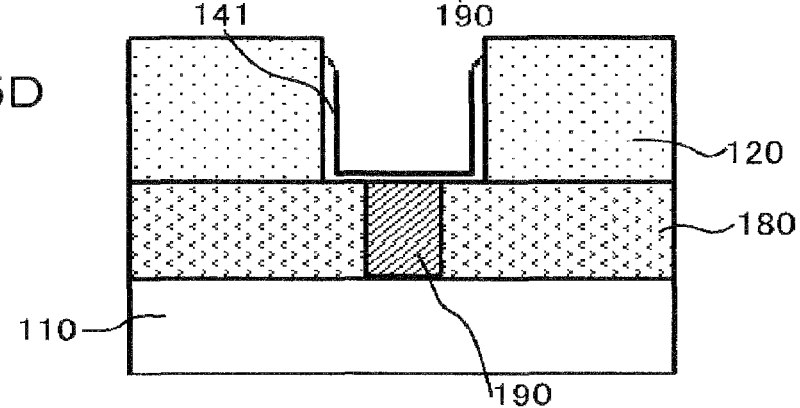

Methods of removing the lower electrode film 141 may be exemplified by a method based on etchback. A conventional method based on etchback has been suffering from the problem in that, as shown in FIG. 5D, also the upper end portion of the lower electrode film 141 formed on the upper portion of the inner wall of the hole 130 may be etched back, so that the surface area of the lower electrode film 141 may decrease, and the capacitance may consequently lower. Even if, as shown in FIG. 5C, the protective film 170 (photoresist film) should have been formed so as to completely fill the hole 130, this problem could have not been solved. In contrast, in the method of manufacturing the semiconductor device 100 of this embodiment, the first insulating film 150 functions as a mask when the lower electrode film 141 is etched back, so that the loss or removal of the upper end portion of the lower electrode film 141 formed so as to cover the inner wall of the hole 130 may be suppressed. As a consequence, reduction in surface area of the lower electrode film 141 and consequent lowering in the capacitance may be suppressed, and such problem may therefore be solved.

Methods of etchback may be exemplified by dry etching using bromine trichloride ($BCl_3$) if the lower electrode film 141 is composed of TiN, and dry etching using chlorine ($Cl_2$) when the film is composed of phosphorus-doped polysilicon. When the protective film 170 is composed of a photoresist film, plasma treatment using oxygen (ashing) may be adoptable.

Next, as shown in FIG. 2B, the capacitor insulating film 142 and the upper electrode 143 are stacked in this order over the lower electrode film 141 so as to fill the hole 130.

Thereafter, the capacitor insulating film 142 and the upper electrode 143 are patterned by a publicly-known method making use of a photoresist film, to thereby obtain the structure shown in FIG. 2C. It is to be understood that, although the drawings herein show patterning for only a single DRAM memory cell for the convenience' sake, the capacitor insulating film 142 and the upper electrode 143 in practice are provided commonly with the other DRAM memory cells.

Further by forming the insulating film 160 by a publicly-known method, the DRAM capacitor portion shown in FIG. 2D may be formed.

Second Embodiment

Figure 3A:
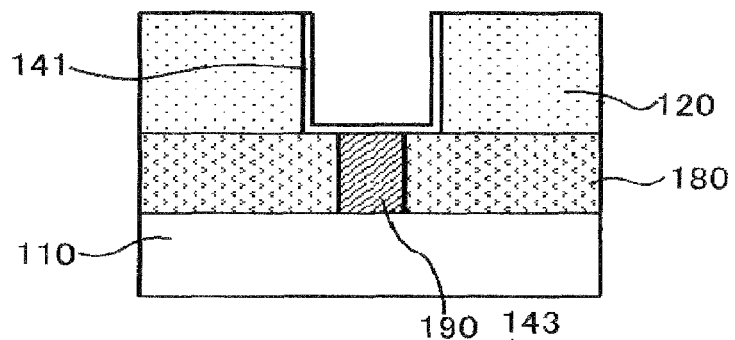
FIGS. 3A to 3D, and FIGS. 4A and 4B are sectional views showing procedures of manufacturing a semiconductor device according to another embodiment of the present invention.
Figure 3B:
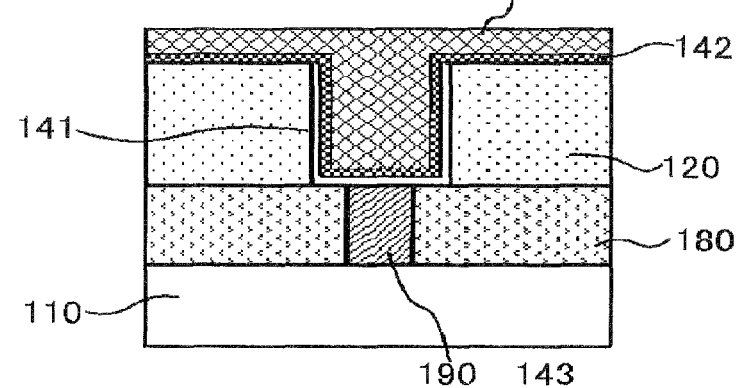
Figure 3C:
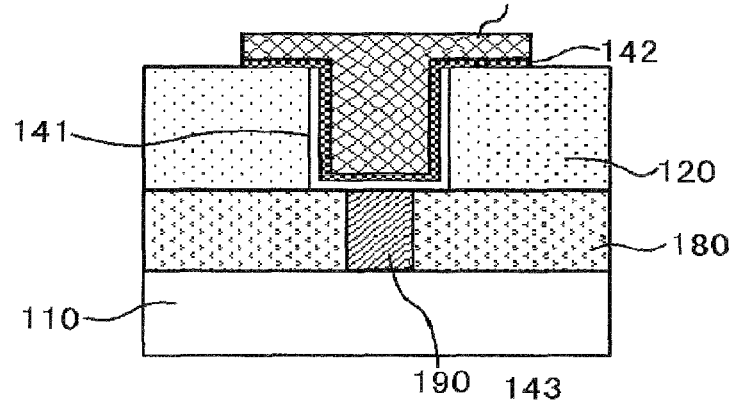
Figure 3D:
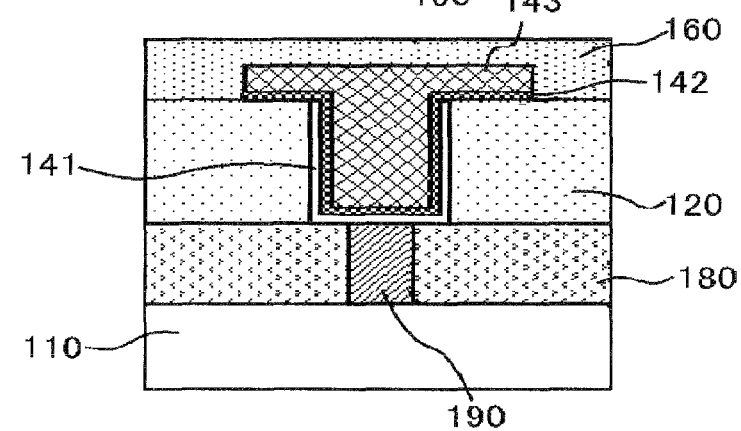

The semiconductor device 100 of this embodiment is configured almost similarly to the semiconductor device 100 of the first embodiment explained referring to FIGS. 1A to 1D and FIGS. 2A to 2D, but is different from the first embodiment in that the first insulating film 150 has been removed (FIG. 3D). Description on the configurations similar to those of the first embodiment will not be repeated.

The semiconductor device 100 of this embodiment may be manufactured as described below. First, similarly to as explained in the first embodiment, the semiconductor device configured as shown in FIG. 2A is formed. Next, the first insulating film 150 used as an etching stopper for etchback of the lower electrode film 141 is removed (FIG. 3A). Methods of removal may be exemplified by wet etching using phosphoric acid or the like. In this case, the first insulating film 150 may be exemplified by a nitride film. Thereafter, similarly to as explained in the first embodiment, the capacitor insulating film 142 and the upper electrode 143 are stacked in this order over the lower electrode film 141 so as to fill the hole 130 (FIG. 3B), and the capacitor insulating film 142 and the upper electrode 143 are patterned making use of a photoresist film, to thereby obtain the structure shown in FIG. 3C. Further by forming the insulating film 160, the DRAM capacitor portion shown in FIG. 3D may be formed.

Also in this embodiment, almost no influence to the capacitance as compared with that in the first embodiment is observed, so that effects equivalent to those in the first embodiment may be obtained.

Third Embodiment

Figure 4A:
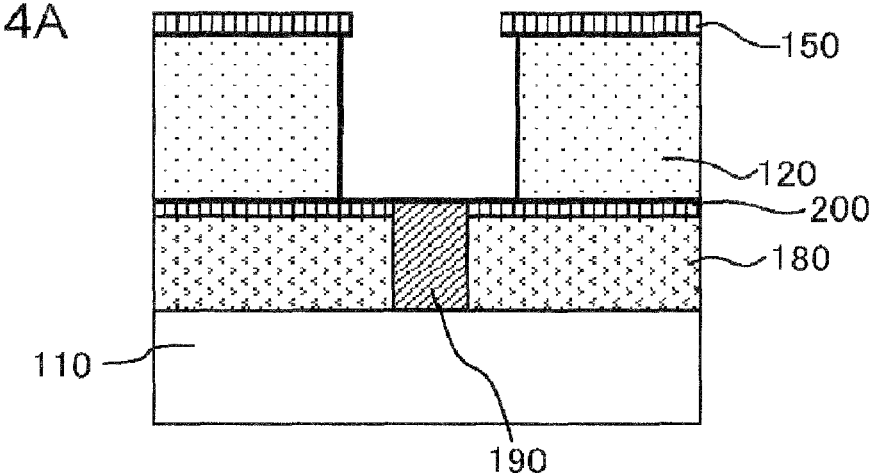
Figure 4B:
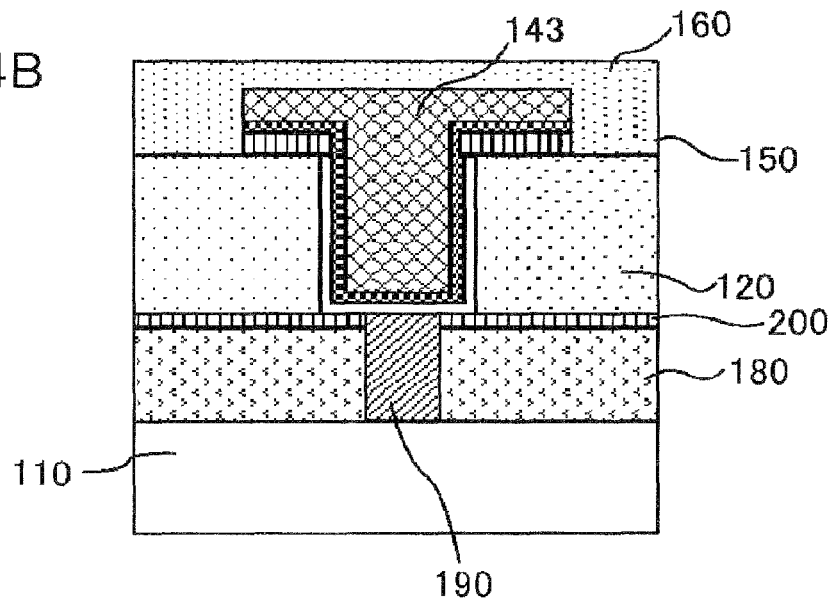

The semiconductor device 100 of this embodiment is configured almost similarly to the semiconductor device 100 of the first embodiment, but is different from the first embodiment in that a third insulating film 200 is formed between the second insulating film 180 and the insulating interlayer 120, and in that the contact 190 is formed as being extended through the second insulating film 180 and the third insulating film 200 (FIG. 4B). Description on the configurations similar to those of the first embodiment will not be repeated.

The semiconductor device 100 of this embodiment may be manufactured as described below. First, the second insulating film 180 and the third insulating film 200 are stacked in this order, between the silicon substrate 110 and the insulating interlayer 120 (not shown). Next, by publicly-known methods, the third insulating film 200 and the second insulating film 180 are selectively removed in this order, to thereby form a contact hole as being extended through the second insulating film 180 and the third insulating film 200, and the contact 190 later connected to the lower electrode film 141 is formed in the hole (not shown). The third insulating film 200 is used as an etching stopper film for protecting the second insulating film 180, when the hole is formed as being extended through the insulating interlayer 120 and the first insulating film 150. The lower electrode film 141 herein is contained in the cylindrical capacitor 140 formed by the succeeding processes in the insulating interlayer 120.

Next, similarly to as explained in the first embodiment, the insulating interlayer 120 and the first insulating film 150 are stacked in this order, the first insulating film 150 and the insulating interlayer 120 are then selectively removed in this order, to thereby form the hole 130 as being extended through the first insulating film 150 and the insulating interlayer 120, and the inner wall of the hole 130 is side-etched specifically in the portion of the insulating interlayer 120, to thereby form a structure having the first insulating film 150 projected out from the edge towards the center of the hole 130 (FIG. 4A). Processes thereafter are proceeded similarly to as described in the first embodiment, so that the explanation will not be repeated. The DRAM capacitor portion as shown in FIG. 4B may similarly be formed.

Figure 7:
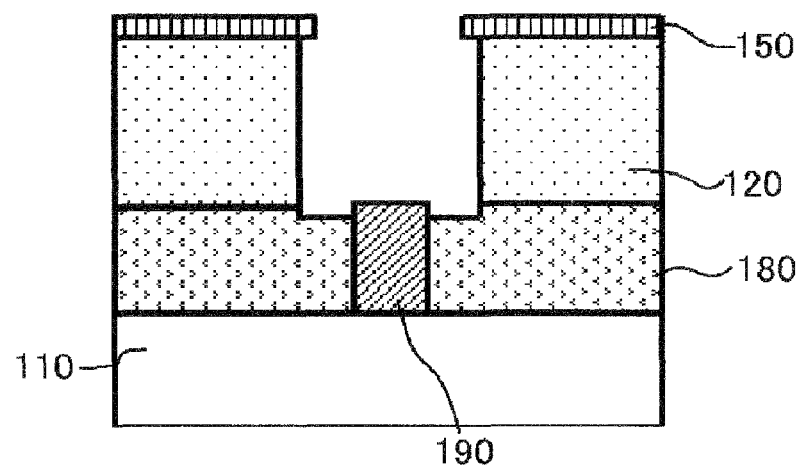
FIG. 7 is a sectional view explaining a problem in a conventional method of manufacturing.

This embodiment raises effects below. Assuming now that the insulating interlayer 120 and the second insulating film 180 are composed of the same film species (material), etch-rate of the both will be equal, so that a structure shown in FIG. 7 may supposedly appear if the third insulating film 200 is not provided. More specifically, when the hole 130 is formed in the first insulating film 150 and the insulating interlayer 120 by selectively removing the first insulating film 150 and the insulating interlayer 120 in this order, and when the insulating interlayer 120 is side-etched, the second insulating film 180 may excessively be etched, supposedly making the contact 190 project out therefrom. In such a case, projection of the contact 190 may induce concentration of electric field, and may therefore be causative of leakage of current.

In the semiconductor device of this embodiment, the third insulating film 200 is used as a stopper film, so that etching of the second insulating film 180 may be suppressed even if the insulating interlayer 120 and the second insulating film 180 are of the same film species, and therefore the contact 190 may be prevented from being projected.

Materials for composing the third insulating film 200 may be exemplified by a silicon nitride film. The second insulating film 180 and the insulating interlayer 120 in this case may commonly be composed of a silicon oxide film.

Although a double-layered structure having the third insulating film 200 formed over the second insulating film 180 was shown in this embodiment, similar effects may be obtained even for a multi-layered structure, so far as the third insulating film 200 is provided as the topmost layer. Also in this embodiment, effects similar to those in the first embodiment may be obtained.

The embodiments of the present invention have been described referring to the attached drawings, merely as examples of the present invention, and allow adoption of other various configurations.

It is apparent that the present invention is not limited to the above embodiment, that may be modified and changed without departing from the scope and spirit of the invention.

What is claimed is:

1. A method of manufacturing a semiconductor device, comprising:
    stacking, over a semiconductor substrate, an insulating interlayer and a first insulating film in this order;
    selectively removing said first insulating film and said insulating interlayer in this order, to thereby form a hole as being extended through said first insulating film and said insulating interlayer;
    allowing side-etching of an inner wall of said hole to proceed specifically in a portion of said insulating interlayer, to thereby form a structure having said first insulating film projected out from the edge towards the center of said hole;
    forming a lower electrode film as being extended over the top surface, side face and back surface of said first insulating film, and over the inner wall and bottom surface of said hole;
    filling a protective film in said hole;
    removing said lower electrode film specifically in portions fallen on the top surface and side face of said first insulating film;
    removing said protective film;
    stacking, in said hole and over said lower electrode film, a capacitor insulating film and an upper electrode in this order;
    patterning said first insulating film, said capacitor insulating film and said upper electrode so as to align an end surface of said first insulating film with an end surface of said capacitor insulating film and with an end surface of said upper electrode; and
    forming a fourth insulating film on said insulating interlayer and said upper electrode so as to contact with said end surface of said first insulating film, said end surface of said capacitor insulating film and said end surface of said upper electrode.

2. The method of manufacturing a semiconductor device as claimed in claim 1, further comprising:
    before stacking the insulating interlayer and the first insulating film in this order over said semiconductor substrate,
    stacking, between said semiconductor substrate and said insulating interlayer, a second insulating film and a third insulating film in this order; and
    selectively removing said third insulating film and second insulating film in this order, to thereby form a contact hole as being extended through said second insulating film and said third insulating film, and then forming, in said contact hole, a contact connected to said lower electrode film,
    wherein in said forming said hole, said hole is formed using said third insulating film as an etching stopper film.

3. The method of manufacturing a semiconductor device as claimed in claim 1, wherein the semiconductor substrate is formed from silicon.

4. The method of manufacturing a semiconductor device as claimed in claim 1, wherein the insulating interlayer has a thickness of from 500 nm to 1.2 μm.

5. The method of manufacturing a semiconductor device as claimed in claim 2, wherein the second insulating film is formed from silicon nitride.

6. The method of manufacturing a semiconductor device as claimed in claim 1, wherein the side etching is a wet etching with a solution containing hydrofluoric acid.

7. The method of manufacturing a semiconductor device as claimed in claim 1, wherein the insulating interlayer is a silicon oxide film.

8. The method of manufacturing a semiconductor device as claimed in claim 1, wherein the first insulating film is formed from silicon nitride.

9. The method of manufacturing a semiconductor device as claimed in claim 1, wherein the first insulating film has a thickness of 20 nm to 100 nm.

10. The method of manufacturing a semiconductor device as claimed in claim 1, wherein the lower electrode film is formed by sputtering.

11. The method of manufacturing a semiconductor device as claimed in claim 1, wherein the lower electrode film is formed from titanium nitride or phosphorous-doped polysilicon.

12. The method of manufacturing a semiconductor device as claimed in claim 1, wherein the lower electrode film has a thickness of 10 nm to 80 nm.

13. The method of manufacturing a semiconductor device as claimed in claim 1, wherein the lower electrode film is formed from titanium nitride and removing the lower electrode film is performed by dry etch using bromine trichloride.

14. The method of manufacturing a semiconductor device as claimed in claim 1, wherein the lower electrode film is formed from phosphorous-doped polysilicon and removing the lower electrode film is performed by dry etch using chlorine.

15. A method of manufacturing a cylindrical capacitor, comprising:
    stacking, over a semiconductor substrate, an insulating interlayer and a first insulating film in this order;
    selectively removing said first insulating film and said insulating interlayer in this order, to thereby form a hole as being extended through said first insulating film and said insulating interlayer;
    allowing side-etching of an inner wall of said hole to proceed specifically in a portion of said insulating interlayer, to thereby form a structure having said first insulating film projected out from the edge towards the center of said hole;
    forming a lower electrode film as being extended over the top surface, side face and back surface of said first insulating film, and over the inner wall and bottom surface of said hole;
    filling a protective film in said hole;
    removing said lower electrode film specifically in portions so that an upper end portion of the lower electrode film is formed on an upper end portion of the inner wall of the hole, and a top surface of the lower electrode film is covered by the projected portion of the first insulating film so that loss or removal of the upper end portion of the lower electrode is suppressed;
    removing said protective film;
    stacking, in said hole and over said lower electrode film, a capacitor insulating film and an upper electrode in this order;
    patterning said first insulating film, said capacitor insulating film and said upper electrode so as to align an end surface of said first insulating film with an end surface of said capacitor insulating film and with an end surface of said upper electrode; and forming a fourth insulating film on said insulating interlayer and said upper electrode so as to contact with said end surface of said first insulating film, said end surface of said capacitor insulating film and said end surface of said upper electrode.

16. The method of manufacturing a cylindrical capacitor as claimed in claim 15, further comprising;

before stacking the insulating interlayer and the first insulating film in this order over said semiconductor substrate, stacking, between said semiconductor substrate and said insulating interlayer, a second insulating film and a third insulating film in this order; and selectively removing said third insulating film and second insulating film in this order, to thereby form a contact hole as being extended through said second insulating film and said third insulating film, and then forming, in said contact hole, a contact connected to said lower electrode film, wherein in said forming said hole, said hole is formed using said third insulating film as an etching stopper film.

17. The method of manufacturing a cylindrical capacitor as claimed in claim 15, wherein the semiconductor substrate is formed from silicon.

18. The method of manufacturing a cylindrical capacitor as claimed in claim 15, wherein the insulating interlayer has a thickness of from 500 nm to 1.2 µm.

19. The method of manufacturing a cylindrical capacitor as claimed in claim 16, wherein the second insulating film is formed from silicon nitride.

20. The method of manufacturing a cylindrical capacitor as claimed in claim 15, wherein the side etching is a wet etching with a solution containing hydrofluoric acid.

* * * * *